US009118379B2

(12) United States Patent
Harverson et al.

(10) Patent No.: US 9,118,379 B2
(45) Date of Patent: Aug. 25, 2015

(54) DUAL N-PORT MPA

(75) Inventors: Michael Harverson, Stevenage (GB); Daryl Jones, Stevenage (GB)

(73) Assignee: ASTRIUM LIMITED, Hertfordshire (GB)

( * ) Notice: Subject to any disclaimer, the term of this patent is extended or adjusted under 35 U.S.C. 154(b) by 314 days.

(21) Appl. No.: 13/643,732

(22) PCT Filed: Apr. 21, 2011

(86) PCT No.: PCT/EP2011/056478
§ 371 (c)(1),
(2), (4) Date: Feb. 7, 2013

(87) PCT Pub. No.: WO2011/134905
PCT Pub. Date: Nov. 3, 2011

(65) Prior Publication Data
US 2013/0130619 A1   May 23, 2013

(30) Foreign Application Priority Data
Apr. 26, 2010   (EP) ..................................... 10275048

(51) Int. Cl.
*H04W 72/04* (2009.01)
*H04Q 7/20* (2006.01)
*H04B 7/14* (2006.01)
*H03F 3/60* (2006.01)
*H03F 3/68* (2006.01)

(52) U.S. Cl.
CPC ................. *H04B 7/14* (2013.01); *H03F 3/602* (2013.01); *H03F 3/68* (2013.01); *H03F 2200/192* (2013.01); *H03F 2200/198* (2013.01); *H03F 2200/204* (2013.01)

(58) Field of Classification Search
CPC ................................. H04B 1/692; H04B 1/005
USPC ......... 455/103, 126, 67.11, 78, 80, 88, 253.2, 455/311, 319, 77, 451; 370/325, 343, 497, 370/537; 342/174, 368; 330/129, 279, 295; 398/71, 72, 75, 58, 135
See application file for complete search history.

(56) References Cited

U.S. PATENT DOCUMENTS

| 4,455,536 A | 6/1984 | Stegens |
| 4,858,229 A * | 8/1989 | Rosen et al. ................. 370/325 |
| 5,101,211 A * | 3/1992 | DuFort .......................... 342/174 |

(Continued)

FOREIGN PATENT DOCUMENTS

| EP | 1 345 321 A1 | 9/2003 |
| JP | 55-083310 A | 6/1980 |

(Continued)

OTHER PUBLICATIONS

International Search Report (PCT/ISA/210) issued on Jul. 6, 2011, by the European Patent Office as the International Searching Authority for International Application No. PCT/EP2011/056478.

*Primary Examiner* — John J Lee
(74) *Attorney, Agent, or Firm* — Buchanan Ingersoll & Rooney PC

(57) ABSTRACT

A hybrid network is disclosed having at least one hybrid coupler, and a plurality of circulators, each circulator having a first port connected to the hybrid network, and further having a second port and a third port. Each circulator is arranged to direct a signal received via the second port to the hybrid network via the first port, and to direct a signal received from the hybrid network towards the third port.

14 Claims, 11 Drawing Sheets

(56) References Cited

U.S. PATENT DOCUMENTS

| | | | |
|---|---|---|---|
| 5,300,894 A * | 4/1994 | Myer et al. | 330/129 |
| 2003/0174018 A1 | 9/2003 | Cooper et al. | |
| 2010/0156528 A1 | 6/2010 | Couchman et al. | |

FOREIGN PATENT DOCUMENTS

| WO | WO 88/01455 A2 | 2/1988 |
|---|---|---|
| WO | WO 2008/135753 A1 | 11/2008 |

* cited by examiner

DUAL N-PORT MPA

The present invention relates to the field of hybrid networks, in particular in relation to hybrid networks for use in multiport amplifiers (MPAs) onboard communications satellites.

In signal processing applications, networks of hybrid couplers are commonly used as power dividers and combiners. For example, in a conventional multiport amplifier 100 shown in FIG. 1, an input hybrid network (INET) 101 splits the input signals A, B, C, D 104 into low-power signals each containing components of all four input signals 104. The low-power signals are amplified by a plurality of amplifiers 102 and recombined by an output hybrid network (ONET) 103 into the amplified output signals A', B', C', D' 105. MPAs are attractive because they can provide a higher output power than a single high power amplifier and have inherent routing properties.

As shown in FIG. 2, the INET 101 comprises four hybrid couplers 110, 111, 112, 113. The path taken by an input signal A is shown in bold. The input signal A is split by a first hybrid coupler 110 into two half-power signals ($A_0$—3 dB; $A_{90}$—3 dB), one of which is in-phase with the input signal and the other of which is phase-shifted by 90°. These half-power signals are split again to give the four low-power output signals ($A_0$—6 dB; $A_{90}$—6 dB; $A_{90}$—6 dB; $A_{180}$—6 dB), each having ¼ the power of the original input signal A. These ¼-power signals can be amplified and then recombined in the ONET 103, which is a mirror image of the INET 101.

Accurate phase-alignment of the INET 101 and ONET 103 is important, since incorrect alignment may result in, for example, the amplified output signal A' containing components of the input signals B, C and D. Therefore, the INET 101 and ONET 103 must be accurately formed and carefully aligned, which can be expensive and time-consuming. A typical hybrid network for use in an MPA on a communications satellite may cost ~£250 k. Furthermore, the hybrid networks are bulky and may contribute significantly to the overall weight of the MPA.

The present invention aims to address the drawbacks inherent in known arrangements.

According to the present invention, there is provided an apparatus comprising a hybrid network comprising at least one hybrid coupler, a plurality of first input-output IO ports and a plurality of second IO ports, a plurality of first circulators each arranged to direct a signal to one of the first IO ports to be directed through the hybrid network to at least one of the second IO ports, and a plurality of second circulators each arranged to direct a signal to one of the second IO ports to be directed through the hybrid network to at least one of the first IO ports, wherein each circulator of the first and second circulators has a first port connected to the hybrid network, and further has a second port and a third port, wherein each circulator is arranged such that a signal received via the second port is outputted to the hybrid network via the first port, and a signal received from the hybrid network via the first port is outputted via the third port.

The hybrid network may be arranged such that each first IO port is isolated from other ones of the first IO ports, and each second IO port is isolated from other ones of the second IO ports.

The plurality of first circulators may be arranged to receive a plurality of first input signals and the plurality of second circulators may be arranged to receive a plurality of second input signals, such that the first and second input signals are directed through the hybrid network in opposite directions.

The hybrid network may be arranged to receive at least one first input signal via one of the plurality of first IO ports, split the at least one first input signal into a first plurality of reduced-power signals, and output the first plurality of reduced-power signals via the plurality of second IO ports.

The hybrid network may be arranged to receive a first plurality of amplified signals via the plurality of first IO ports, combine said amplified signals into at least one first amplified output signal, and output the first amplified output signal via the plurality of second IO ports.

The hybrid network may be further arranged to receive at least one second input signal via one of the plurality of second IO ports, split the at least one second input signal into a second plurality of reduced-power signals, and output the second plurality of reduced-power signals via the plurality of first IO ports.

The hybrid network may be further arranged to receive a second plurality of amplified signals via the plurality of second IO ports, combine said amplified signals into at least one second amplified output signal, and output the at least one second amplified output signal via the plurality of first IO ports.

According to the present invention, there is also provided a multiport amplifier comprising an input network INET, an output network ONET, and a plurality of amplifiers (811, 821) arranged to amplify signals received from the INET and send the amplified signals to the ONET.

According to the present invention, there is also provided a multiport amplifier comprising a first input-output network, a second input-output network, a first plurality of amplifiers arranged to amplify signals received from the first input-output network and send the amplified signals to the second input-output network, and a second plurality of amplifiers arranged to amplify signals received from the second input-output network and send the amplified signals to the first input-output network.

According to the present invention, there is also provided a multiport amplifier comprising an input-output network comprising the apparatus according to claim 1, and a plurality of amplifiers arranged to amplify signals received from the input-output network and return the amplified signals to the input-output network.

Embodiments of the invention will now be described, by way of example, with reference to the accompanying drawings, in which.

Figure 5A:
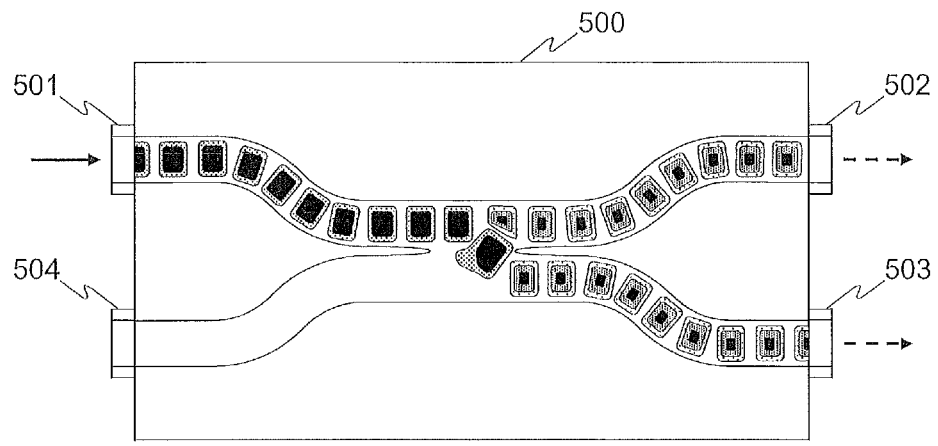
Figure 5B:
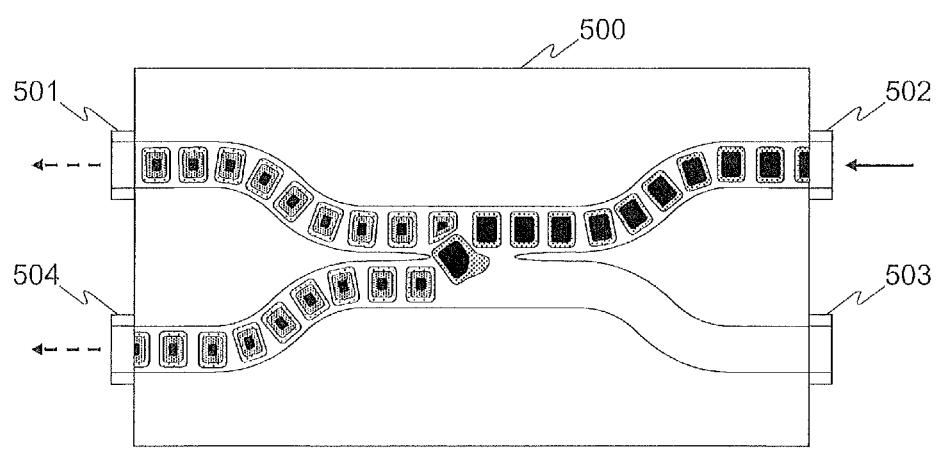
Figure 6A:
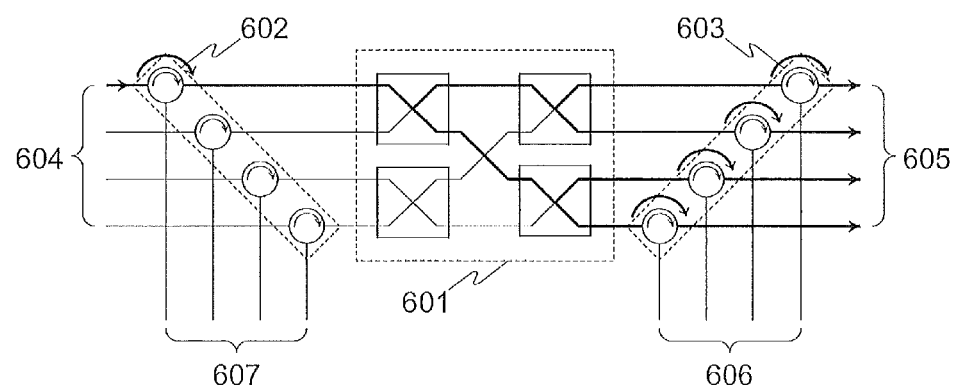
Figure 6B:
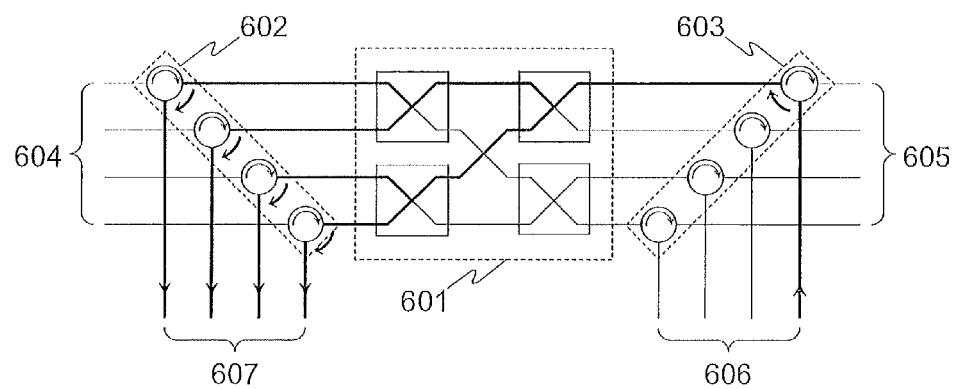
Figure 7A:
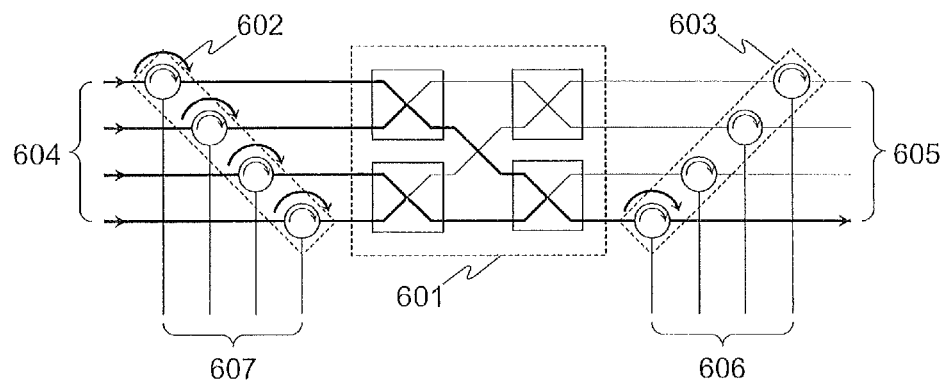
Figure 7B:
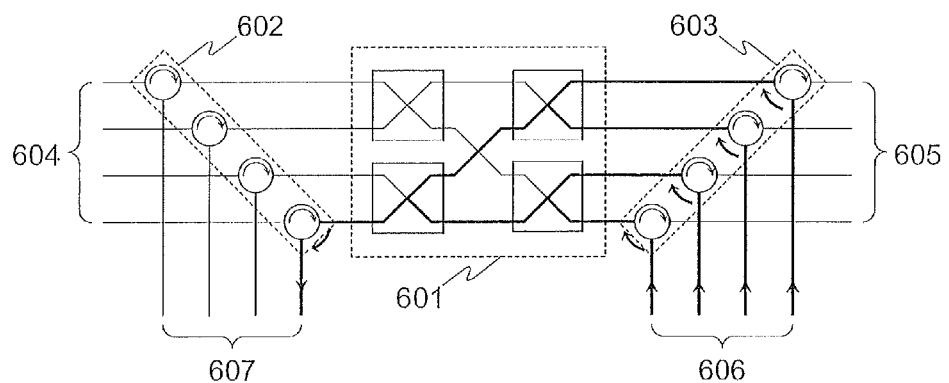
Figure 8:
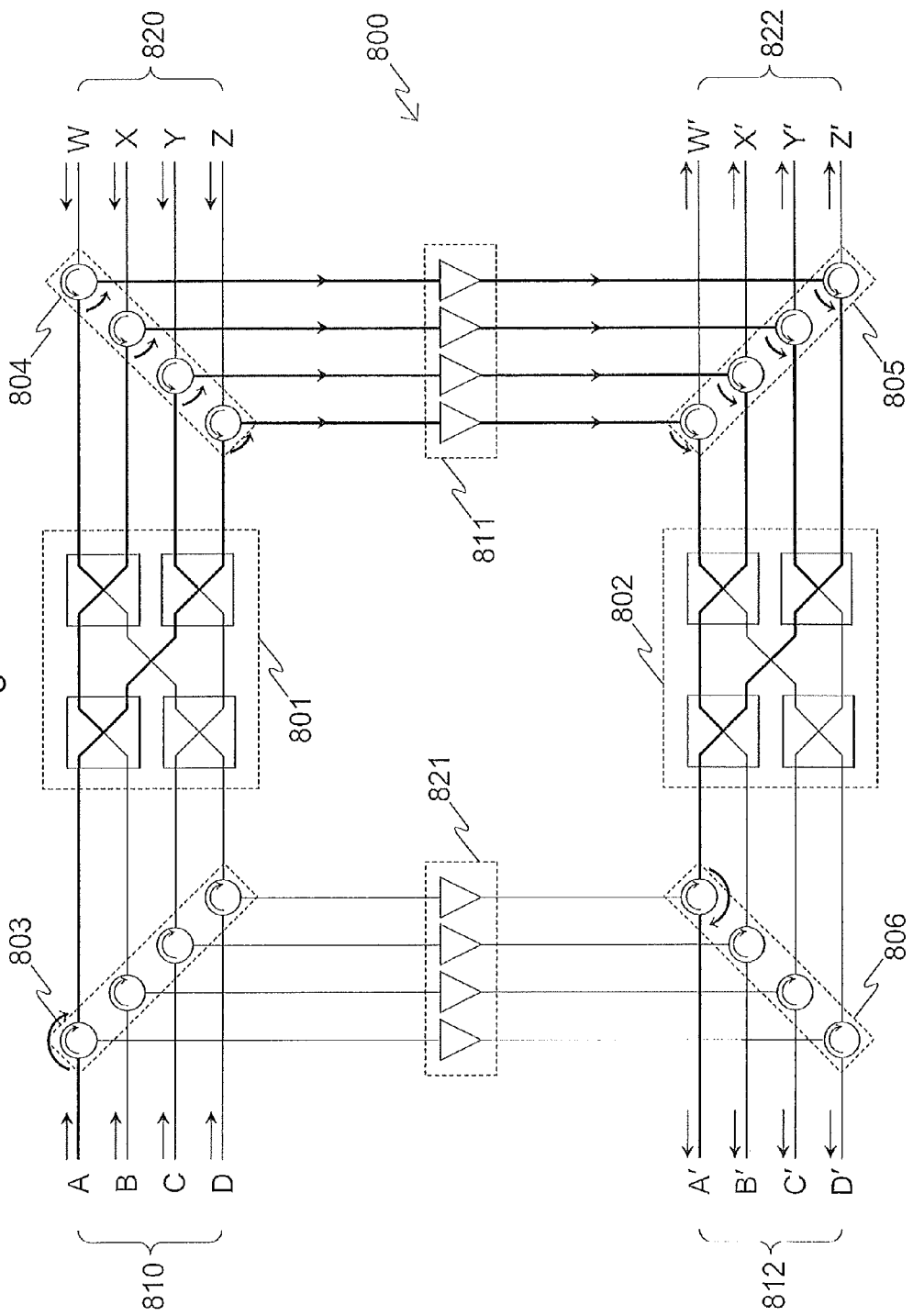
Figure 9:
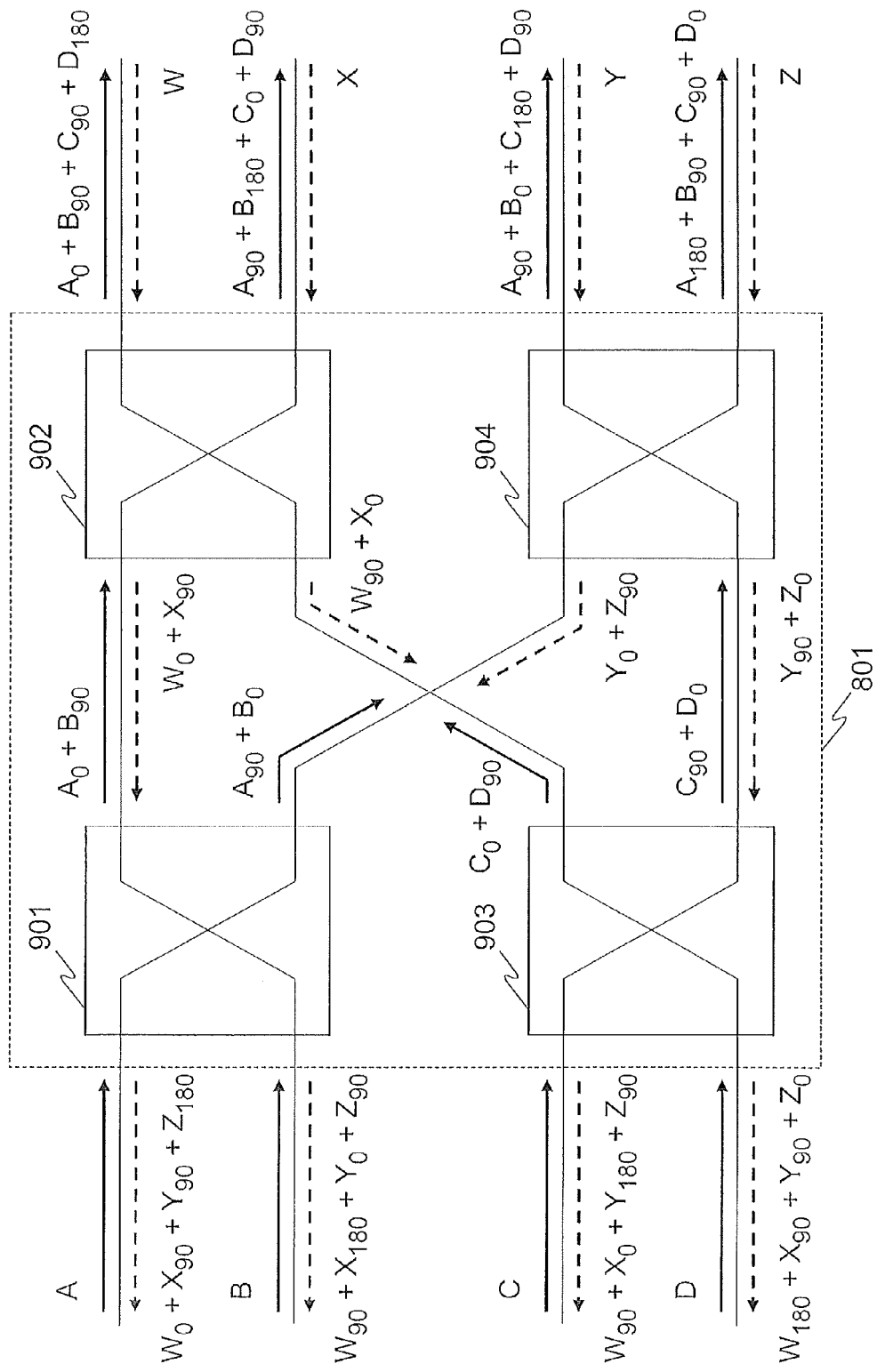
Figure 10:
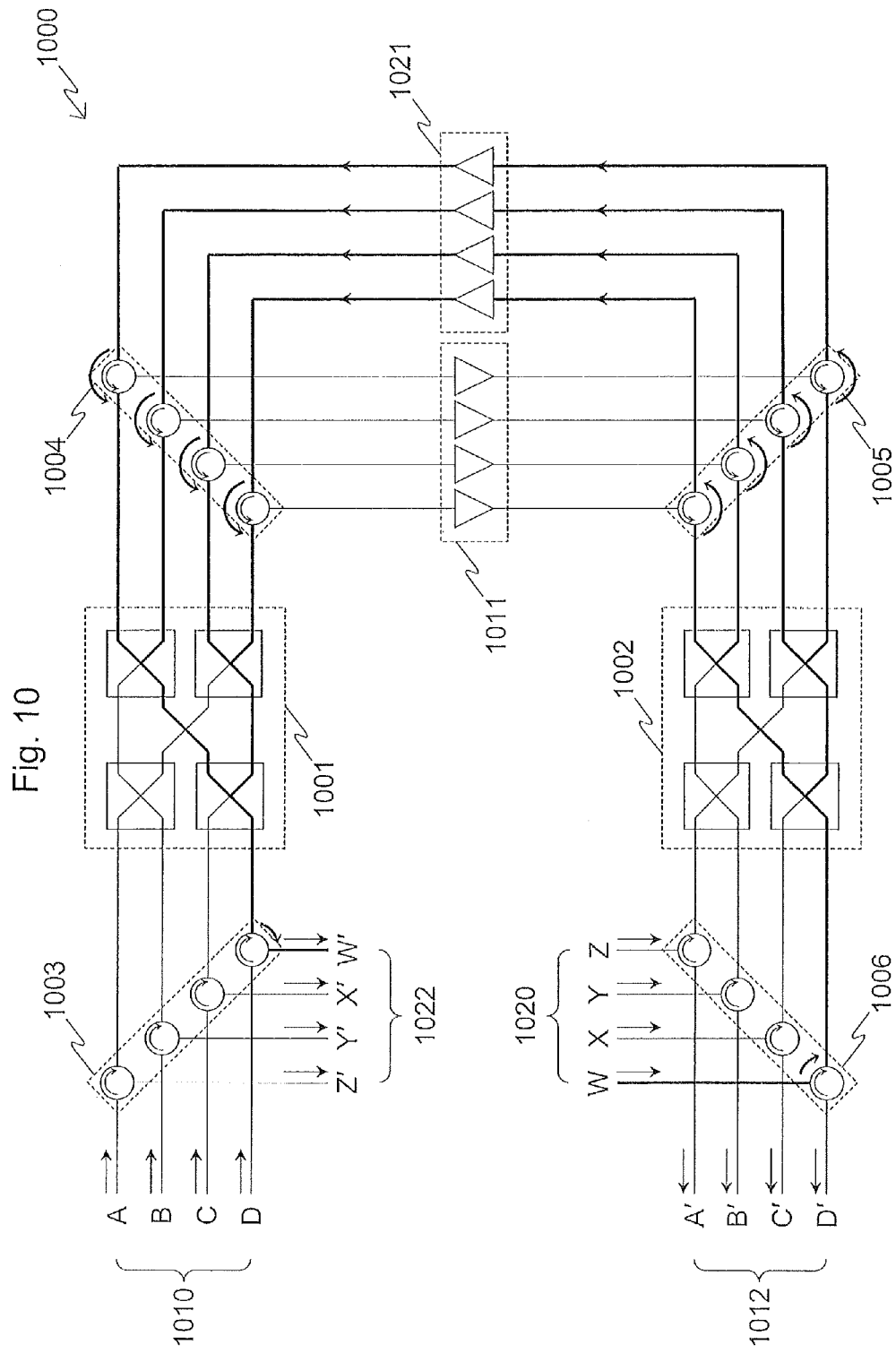
Figure 11:
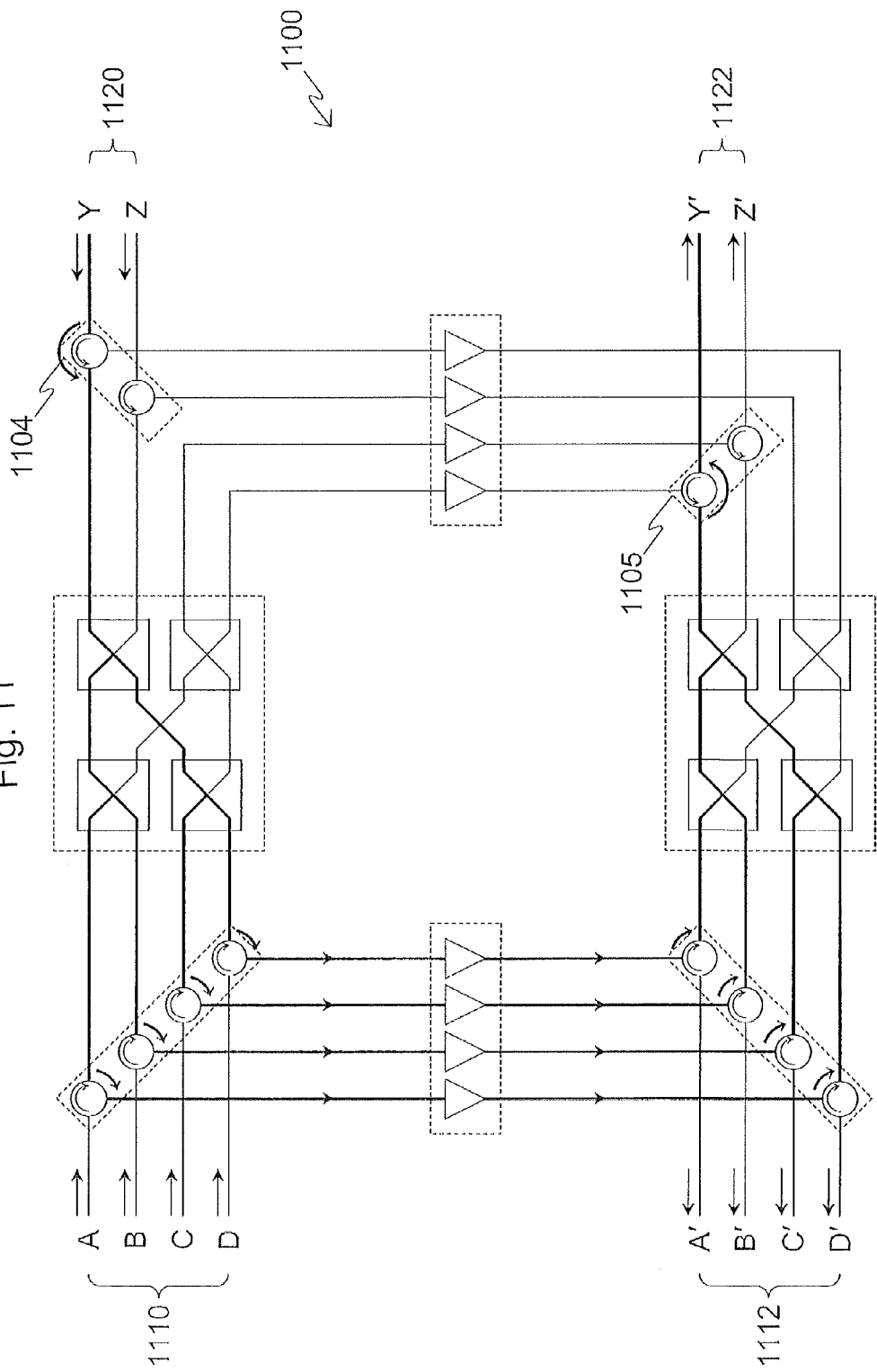
Figure 12:
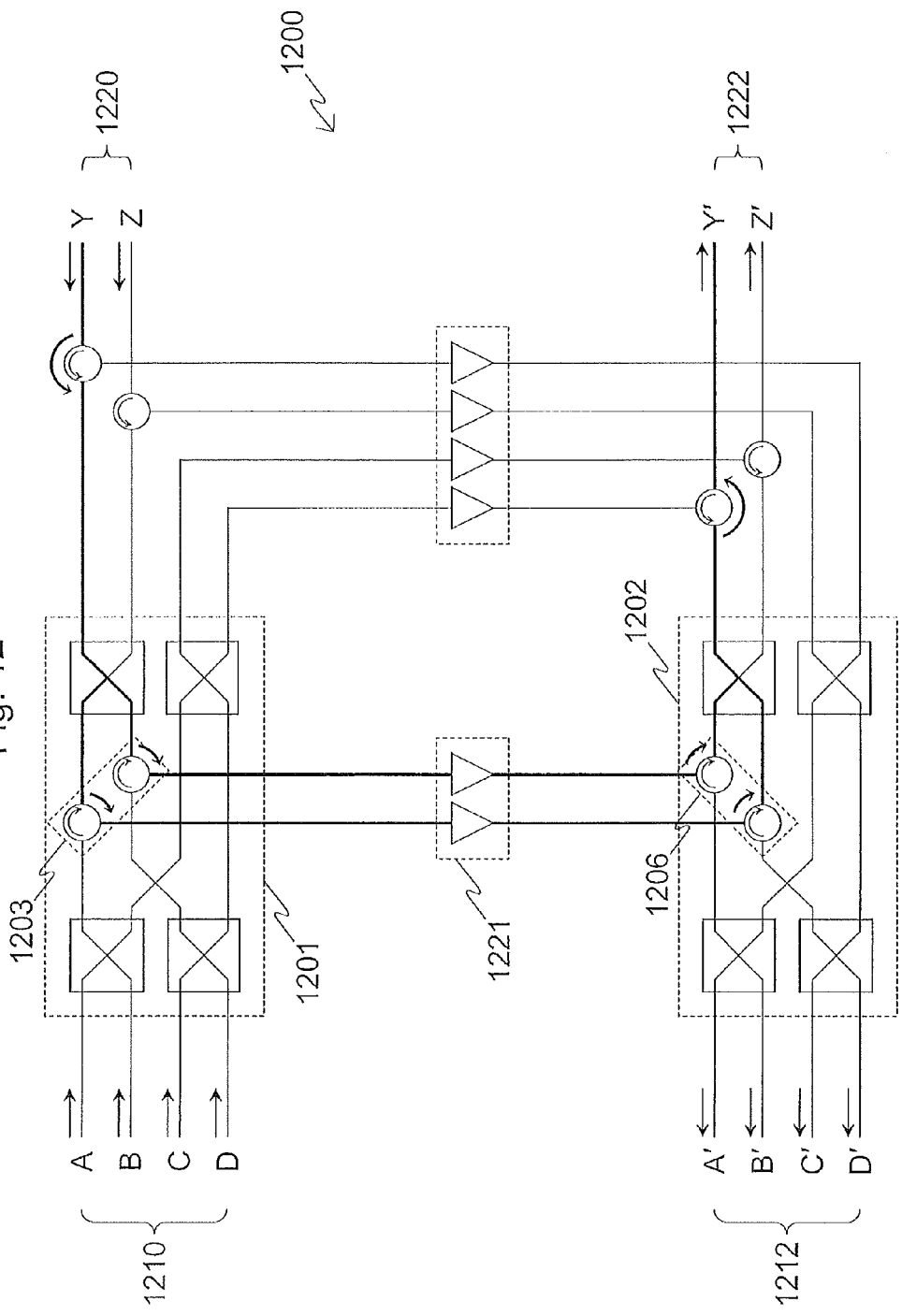
Figure 13:
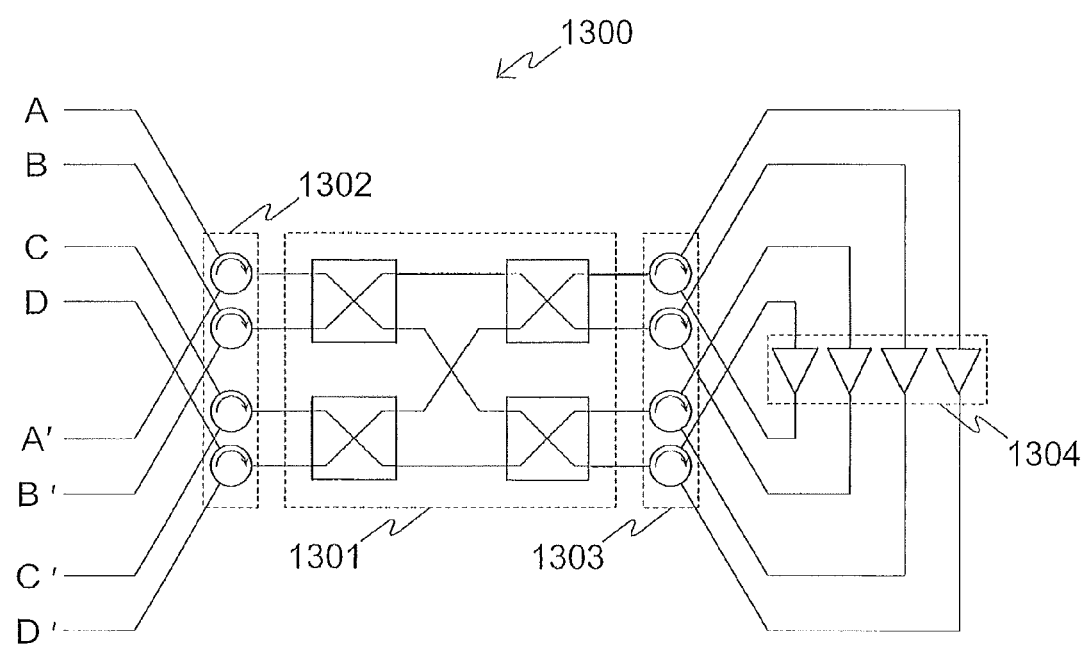

FIGS. 5a and 5b schematically illustrate E-field intensity within a hybrid coupler, according to an example of the present invention;

FIGS. 6a and 6b illustrate a hybrid network functioning as an input network according to an example of the present invention;

FIGS. 7a and 7b illustrate a hybrid network functioning as an output network according to an example of the present invention;

FIG. 8 illustrates an MPA for amplifying eight input signals according to an example of the present invention;

FIG. 9 illustrates in detail the operation of the first hybrid network of the MPA shown in FIG. 8;

FIG. 10 illustrates an MPA for amplifying eight input signals according to an example of the present invention;

FIG. 11 illustrates an MPA for amplifying six input signals according to an example of the present invention;

FIG. 12 illustrates an MPA for amplifying six input signals, according to an example of the present invention; and FIG. 13 illustrates an MPA for amplifying four input signals according to an example of the present invention.

Figure 3:
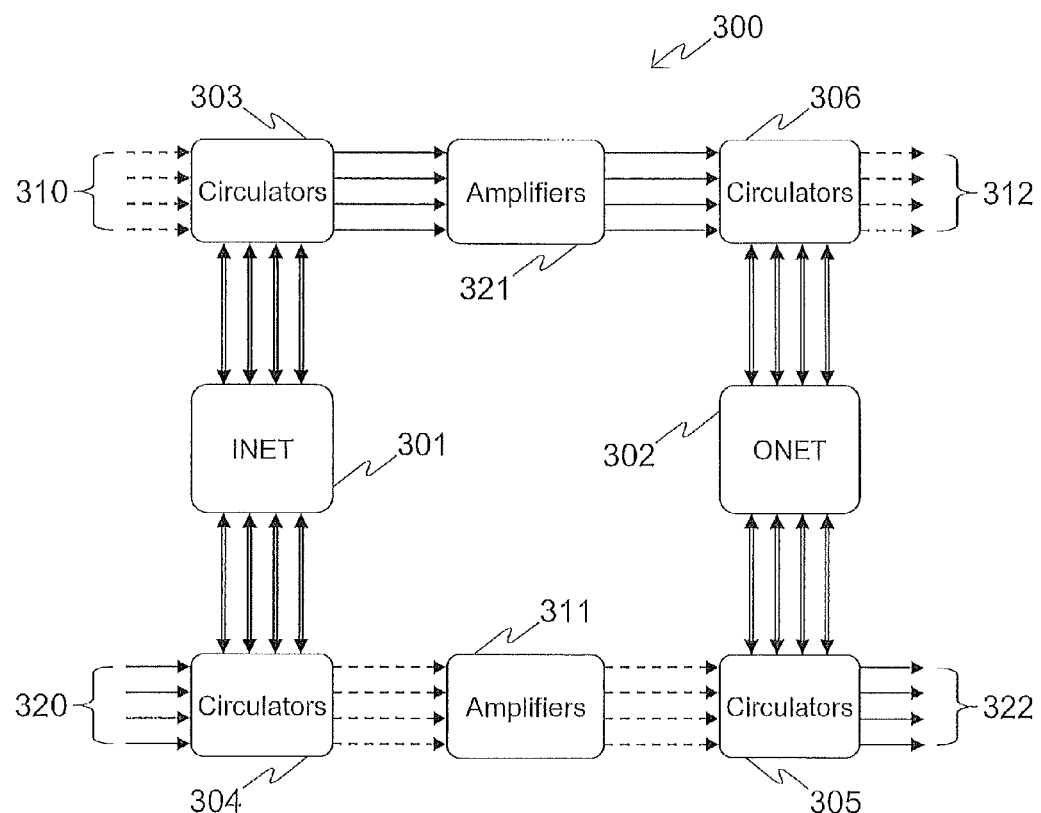
FIG. 3 illustrates an MPA according to an example of the present invention.

Referring now to FIG. 3, an MPA 300 is illustrated according to an example of the present invention. The MPA 300 may be referred to as a dual MPA, since it can process the same number of input signals as two conventional 4-port MPAs (i.e. two sets of four inputs), but requires only a single INET 301 and ONET 302 instead of two INETs and two ONETs.

The dual MPA 300 comprises four pluralities of circulators 303, 304, 305, 306, which are arranged to direct the two sets of input signals 310, 320 through the INET 301 and ONET 302 in opposite directions. In FIG. 3, the path taken through the dual MPA 300 by the first set of input signals 310 is shown by dashed arrows, and the path taken by the second set of input signals 320 is shown by solid arrows. Double-arrows indicate shared couplings, through which the first 310 and second 320 sets of signals pass in opposite directions.

More specifically, the first set of input signals 310 is directed towards the INET 301 by a first plurality of circulators 303, and is split into a plurality of low-power signals. These low-power signals are then directed towards a first block of amplifiers 311 by a second plurality of circulators 304, amplified, and directed towards the ONET 302 by a third plurality of circulators 305. The signals are recombined by the ONET 302 into a first set of output signals 312 and outputted via a fourth plurality of circulators 306.

In contrast, the second set of input signals 320 is input to the second plurality of circulators 304, directed towards the INET 301, and split into a plurality of low-power signals. The second set of input signals 320 therefore passes through the INET 301 in an opposite direction to the first set of input signals 310. These low-power signals are directed towards a second block of amplifiers 321 by the first plurality of circulators 303, amplified, and directed towards the ONET 302 by the fourth plurality of circulators 306. The signals are recombined by the ONET 302 into a second set of output signals 322 and outputted via the third plurality of circulators 305.

In this way, the first 310 and second 320 sets of input signals pass through an INET, a block of amplifiers, and an ONET, similar to a conventional MPA. However, in the present example, the use of circulators to separate signals passing through the INET and ONET in different directions allows a single INET 301 and ONET 302 to be shared. Therefore the cost, complexity and mass of the MPA is reduced.

Figure 4:
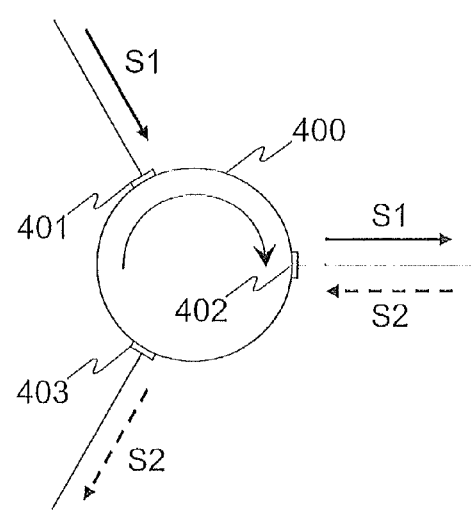
FIG. 4 illustrates a circulator for use in examples of the present invention.

FIG. 4 illustrates a 3-port circulator 400 which may be used in examples of the present invention. The skilled person will be familiar with the operating principles of a circulator, and so a detailed description will not be provided here. In brief, a circulator is a non-reciprocal device, meaning that the power loss between two ports is dependent on the direction of propagation of a signal between the two ports. A circulator is arranged such that when a signal is input to any given port, the signal only propagates towards an adjacent port in either the clockwise or anti-clockwise directions (depending on the orientation of the circulator). Any remaining ports of the circulator are isolated from the input signal.

For example, in the case of a three-port circulator 400 as shown in FIG. 4, a signal S1 which is inputted to a first port 401 is directed towards a second port 402, which in the present example is an adjacent port in the clockwise direction. However, a signal S2 which is inputted to the second port 402 does not propagate towards the first port 401, but is instead directed towards a third port 403. The first port 401 is isolated from signals input to the second port 402. When used in examples of the present invention, the first port 401 may be arranged as an input port (i.e. arranged to receive signals to be input to a hybrid network), the third port 403 may be arranged as an output port (i.e. arranged to output signals received from the hybrid network), and the second port may be connected to the hybrid network itself.

Although a 3-port circulator 400 is illustrated in FIG. 4, the present invention is not limited to 3-port circulators. For example, four-port or N-port circulators may be used in some embodiments of the present invention. As only three ports are required (i.e. an input port 311, an output port 313, and a port 312 for connection to the hybrid network), surplus ports between the first and third ports may be terminated by matched loads. Such arrangements may have the benefit of isolating the first port 401 from the third port 403.

FIGS. 5a and 5b schematically illustrate E-field intensity within a hybrid coupler as signals pass through the hybrid in opposite directions. In FIGS. 5a and 5b, dark areas indicate high intensity and light areas indicate low intensity. The hybrid coupler 500 shown in FIGS. 5a and 5b comprises four ports 501, 502, 503, 504 which are connected by channels through which an electromagnetic wave can propagate. In the example illustrated in FIG. 5a, a high-power signal is input to a first port 501, and split into two half-power signals which are output via a second port 502 and a third port 503. The second port 502 is referred to as the "through" port, since it outputs a half-power signal which is in-phase with the input signal. The third port 503 is referred to as the "quadrature" port, since it outputs a half-power signal which is phase-shifted by 90° with respect to the input signal. The fourth port 504 is referred to as the "isolated" port since it is isolated from the first port 501.

Because hybrid couplers are passive, reciprocal devices, a signal can be input to any one of the four ports 501, 502, 503, 504, in which case the positions of the through, quadrature, and isolated ports will be switched accordingly. For example, FIG. 5b illustrates the same hybrid coupler 500 as FIG. 5a, but with a high-power signal input to the second port 502. In this example, as shown in FIG. 5b, the first port 501 functions as the "through" port, with the fourth port 504 becoming the "quadrature" port and the third port 503 becoming the "isolated" port.

Furthermore, different signals may be input simultaneously at all four ports 501, 502, 503, 504 without interference. By taking advantage of this property, and by combining a hybrid network with circulators, a dual MPA such as the one shown in FIG. 3 therefore allows a single hybrid network to simultaneously process two sets of input signals, by passing the two sets of signals through the network in opposite directions.

The function of the hybrid network in combination with the circulators will now be described with reference to FIGS. 6a to 7b. Specifically, FIGS. 6a and 6b illustrate a hybrid network 601 functioning as an INET (i.e. splitting an input signal), and FIGS. 7a and 7b illustrate the hybrid network 601 functioning as an ONET (i.e. combining several lower-power signals into a higher-power output signal).

As shown in FIGS. 6a and 6b, a hybrid network 601 comprising four hybrid couplers is coupled on one side to a first plurality of circulators 602, and on the other side to a second plurality of circulators 603. This arrangement provides a plurality of first inputs 604 and first outputs 605, and a plurality of second inputs 606 and second outputs 607. In the present example, a signal input to one of the first inputs 604 passes through the hybrid network 601 from left to right and is split into a plurality of lower-power signals, which are output via the first outputs 605. A signal input to one of the second inputs 606 passes through the hybrid network 601 from right to left and is split into a plurality of lower-power signals, which are output via the second outputs 607. In FIG. 6a, a path taken by a signal input to one of the first inputs 604 is shown in bold. In FIG. 6b, a path taken by a signal input to one of the second inputs 606 is shown in bold.

Referring now to FIGS. 7a and 7b, the apparatus of FIGS. 6a and 6b is illustrated functioning as an ONET. Paths taken by various signals through the apparatus are shown in bold. In FIG. 7a, a plurality of lower-power signals are provided to the first inputs 604, combined into a single higher-power output signal by the hybrid network 601 and output via the first outputs 605. In FIG. 7b, a plurality of lower-power signals are provided to the second inputs 606, combined into a single higher-power output signal by the hybrid network 601 and output via the first outputs 607.

As the arrangement of hybrid network 601 and circulators 602, 603 in FIGS. 6a to 7b is identical, a single hybrid network may function as an INET or an ONET for either set of input signals. For example, the same apparatus may simultaneously act as an INET for low-power signals received via the first inputs 604 and an ONET for amplified signals received via the second inputs 606, or vice versa. Alternatively, the same apparatus may simultaneously act as an INET for both sets of inputs 604, 606, or as an ONET for both sets of inputs 604, 606.

Referring now to FIG. 8, a dual MPA 800 is illustrated according to an example of the present invention. The dual MPA 800 functions in a similar manner to the dual MPA 300 of FIG. 3. Specifically, the dual MPA comprises a plurality of first inputs 810 and first outputs 812, and a plurality of second inputs 820 and second outputs 822. Pluralities of circulators 803, 804, 805, 806 are provided for directing input signals through the hybrid networks 801, 802 and amplifiers 811, 821 in the correct order.

In the present example, the first hybrid network 801 functions as an INET for both the first 810 and second 820 inputs, and the second hybrid network 802 functions as an ONET for both the first 812 and second 822 outputs. For example, in FIG. 8, the path taken by a signal A through the dual MPA 800 is shown in bold. The signal A is inputted to one of the first inputs 810, the circulators 803, 804, 805, 806 being arranged to direct the signal A to the first hybrid network 801, through the first plurality of amplifiers 811, and through the second hybrid network 802 to be outputted as an amplified signal A'.

A signal inputted to one of the second inputs 820 (e.g. signals W, X, Y, Z) is arranged to pass through the first hybrid network 801 in an opposite direction to signals from the first inputs 810, be amplified by the second plurality of amplifiers 821, and pass through the second hybrid network 802, again in an opposite direction to signals from the first inputs 810.

FIG. 9 illustrates in detail the operation of the first hybrid network of the MPA shown in FIG. 8. Phase relationships between similar signals in FIG. 9 are denoted by subscripts, e.g. $A_{90}$ denotes a signal similar to the input signal A, but phase-shifted by 90° relative to the original input signal A. In FIG. 9, for clarity, relative amplitudes are not shown, but are the same as in a conventional hybrid network (i.e. a signal is reduced by 3 dB by each hybrid coupler through which it passes).

The hybrid network 801 comprises four hybrid couplers 901, 902, 903, 904 arranged in a similar fashion to a conventional hybrid network. Signals A, B, C, D are received from the plurality of first inputs (cf. FIG. 8), and pass through the hybrid network 801 from left to right. Each port on the right-hand side of the hybrid network 801 (as viewed in FIG. 9) therefore outputs a low-power signal containing components of each input signal (e.g. $A_0 + B_{90} + C_{90} + D_{180}$).

Signals W, X, Y, Z are received from the plurality of second inputs (cf. FIG. 8), and pass through the hybrid network 801 from right to left (i.e. an opposite direction to signals A, B, C, D). As the hybrid network is symmetrical and reciprocal, signals from the plurality of second inputs (i.e. signals W, X, Y, Z) are split and reduced in power in a similar fashion to signals from the plurality of first inputs (i.e. signals A, B, C, D).

The port-to-port isolation between an input port and an isolated port of a hybrid coupler may typically be ~50 dB. Hence, if signals passing through the hybrid coupler in one direction are ~50 dB more powerful than signals passing in the other direction, the lower-power signals may be subject to interference. As discussed above, in the present example the first hybrid network 801 functions as an INET for both sets of input signals, and the second hybrid network 802 functions as an ONET for both sets of signals. Therefore, such interference may be avoided since the first hybrid network 801 carries only the low-power signals, and the second hybrid network 802 carries only the high-power signals.

However, in other examples of the present invention, a single hybrid network may function as both an INET and an ONET. Such arrangements may, for example, be suitable for use in situations where the port-to-port isolation is greater than the power difference between the low-power signals and the high-power signals. An example of the present invention in which each hybrid network functions as both an INET and an ONET will now be described with reference to FIG. 10.

Referring now to FIG. 10, a dual MPA is illustrated according to an example of the present invention. Like the dual MPA of FIG. 8, the dual MPA 1000 of FIG. 10 comprises first 1001 and second 1002 hybrid networks, first 1011 and second 1021 pluralities of amplifiers, and four pluralities of circulators 1003, 1004, 1005, 1006. However, unlike the dual MPA of FIG. 8, the dual MPA 1000 of the present example is arranged such that each hybrid network 1001, 1002 acts as both an INET and an ONET. Specifically, signals provided to a plurality of first inputs 1010 (i.e. signals A, B, C, D) are split by the first hybrid network 1001, amplified by the first plurality of amplifiers 1011, recombined by the second hybrid network 1002, and outputted via the plurality of first outputs 1012 (cf. amplified signals A', B', C', D'). The first hybrid network 1001 therefore functions as an INET for the plurality of first inputs, whilst the second hybrid network 1002 functions as an ONET.

In contrast, signals provided to a plurality of second inputs 1020 (i.e. signals W, X, Y, Z) are split by the second hybrid network 1002, amplified by the second plurality of amplifiers 1021, recombined by the first hybrid network 1001, and outputted via the plurality of second outputs 1022 (cf. amplified signals W', X', Y', Z'). The second hybrid network 1002 therefore functions as an INET for the plurality of second inputs, whilst the first hybrid network 1001 functions as an ONET. The path taken by a signal W is shown in bold.

Typically, during operation, an ONET will experience greater heating than an INET as the signals passing through are amplified in comparison to the signals passing through an INET. In the dual MPA 1000 of FIG. 10 each hybrid network 1001, 1002 functions as an ONET for one set of signals. Therefore both hybrid networks 1001, 1002 will experience a similar heating rate and may expand at a similar rate. Uniform expansion of both hybrid networks 1001, 1002 may help to maintain accurate phase-alignment between the networks, which is necessary to avoid interference in the output signals.

Referring now to FIG. 11, a dual MPA is illustrated according to an example of the present invention. Certain aspects of the dual MPA 1100 are similar to those of the dual MPA of FIG. 8, and so a detailed description will not be provided here. However, the dual MPA 1100 of FIG. 11 differs in that the plurality of second inputs 1120 and second outputs 1122 comprise only two inputs and two outputs. Consequently, the second 1104 and third 1105 pluralities of circulators only comprise two circulators each, instead of four (cf. FIG. 8). For clarity in FIG. 11, the path taken by an input signal Y through the dual MPA 1100 is shown in bold.

As shown in FIG. 11, in some embodiments of the present invention, a different number of input signals may be provided to each side of a hybrid network within the dual MPA. Effectively, the dual MPA 1100 combines a four-port MPA (cf. first inputs 1110 and first outputs 1112) with a two-port MPA (cf. second inputs 1120 and second outputs 1122). However, the skilled person will appreciate that other arrangements are possible, depending on the number of input signals which are required to be amplified.

Referring now to FIG. 12, a dual MPA is illustrated according to an example of the present invention. The dual MPA 1200 has a plurality of first inputs 1210 and first outputs 1212 which are arranged to receive four input signals and output four amplified signals. The dual MPA 1200 also has a plurality of second inputs 1220 and second outputs 1222 which are arranged to receive two input signals and output two amplified signals. Therefore, like the dual MPA of FIG. 11, the dual MPA 1200 of FIG. 12 effectively combines a four-port MPA and a two-port MPA.

However, the dual MPA 1200 differs in that the first 1203 and fourth 1206 pluralities of circulators are disposed between hybrid couplers of the first 1201 and second 1202 hybrid networks, respectively. Therefore, signals Y, Z input to the second inputs 1220 are arranged to pass through only a single hybrid coupler of the first hybrid network 1201, and hence are only split into two lower-power signals. The number of amplifiers in the second plurality of amplifiers 1221 can therefore be reduced from four (cf. FIG. 11) to two. For clarity in FIG. 12, the path taken by an input signal Y through the dual MPA 1200 is shown in bold.

Figure 1:
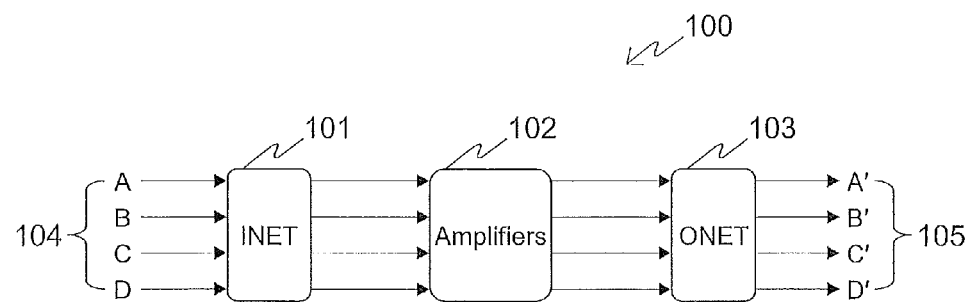
FIG. 1 illustrates a conventional multiport amplifier (MPA)
Figure 2:
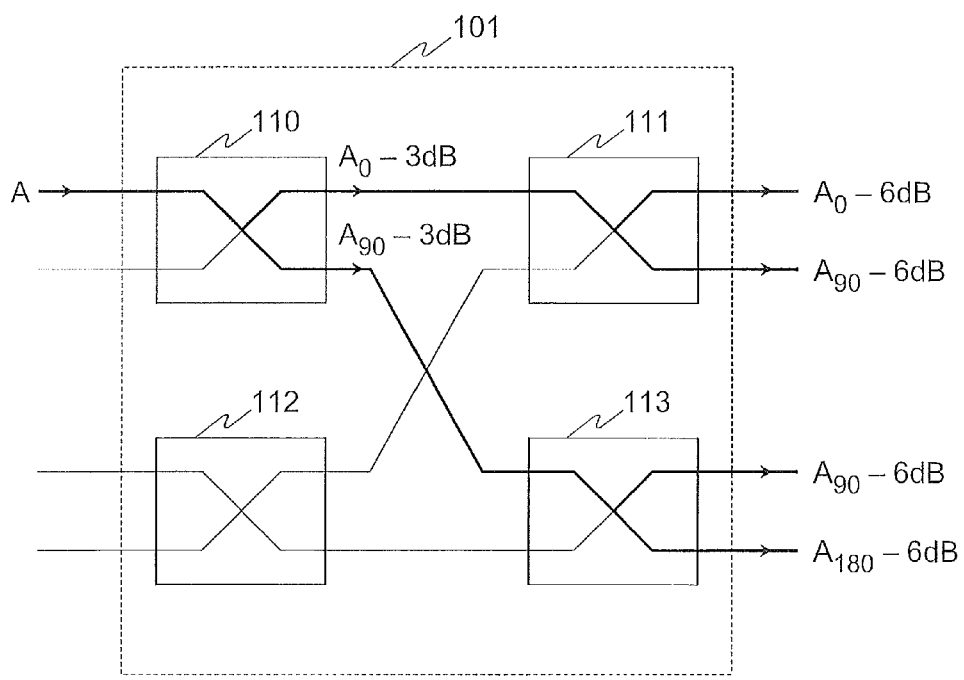
FIG. 2 illustrates an input hybrid network of the MPA of FIG. 1.

Referring now to FIG. 13, an MPA is illustrated according to an example of the present invention. Like a conventional 4-port MPA (cf. FIG. 1), the MPA 1300 of FIG. 13 is arranged to receive four input signals (A, B, C, D), split each signal into a plurality of lower-power signals which are passed through a plurality of amplifiers 1304, and recombine the amplified signals into four amplified output signals (A', B', C', D'). However, in the present example, only a single hybrid network 1301 is used, the hybrid network 1301 functioning as both INET and ONET. Pluralities of circulators 1302, 1303 are used to separate signals passing through the hybrid network in one direction from signals passing through in the opposite direction. In comparison to a conventional 4-port MPA, this embodiment has the benefit that only one hybrid network is required instead of two.

Whilst certain embodiments of the invention have been described above, it will be clear to the skilled person that many variations and modifications are possible while still falling within the scope of the invention as defined by the claims.

For example, although the present invention has been described in relation to multiport amplifiers, in other embodiments alternative signal processing apparatus may be substituted in place of the amplifiers.

The invention claimed is:

1. Apparatus comprising:
   a hybrid network having at least one hybrid coupler, a plurality of first input-output IO ports and a plurality of second IO ports;
   a plurality of first circulators each arranged to direct a signal to one of the first IO ports to be directed through the hybrid network to at least one of the second IO ports; and
   a plurality of second circulators each arranged to direct a signal to one of the second IO ports to be directed through the hybrid network to at least one of the first IO ports,
   wherein each circulator of the first and second circulators has a first port connected to the hybrid network, and has a second port and a third port,
   wherein each circulator is arranged such that a signal received via the second port will be outputted to the hybrid network via the first port, and a signal received from the hybrid network via the first port will be outputted via the third port,
   wherein the plurality of first circulators are arranged to receive a plurality of first input signals and the plurality of second circulators are arranged to receive a plurality of second input signals, such that the first and second input signals are directed through the hybrid network in opposite directions, and
   wherein the hybrid network is arranged to receive at least one first input signal via one of the plurality of first IO ports, split the at least one first input signal into a first plurality of reduced-power signals, and output the first plurality of reduced-power signals via the plurality of second IO ports.

2. The apparatus of claim 1, wherein the hybrid network is arranged such that each first IO port is isolated from other ones of the first IO ports, and each second IO port is isolated from other ones of the second IO ports.

3. The apparatus of claim 2, wherein the plurality of first circulators are arranged to receive a plurality of first input signals and the plurality of second circulators are arranged to receive a plurality of second input signals, such that the first and second input signals are directed through the hybrid network in opposite directions.

4. A multiport amplifier comprising:
   an input network INET having an apparatus according to claim 3;
   an output network ONET having an apparatus according to claim 3; and
   a plurality of amplifiers arranged to amplify signals received from the INET and send the amplified signals to the ONET.

5. A multiport amplifier comprising:
   a first input-output network having an apparatus according to claim 3;
   a second input-output network having an apparatus according to claim 3;
   a first plurality of amplifiers arranged to amplify signals received from the first input-output network and send the amplified signals to the second input-output network; and
   a second plurality of amplifiers arranged to amplify signals received from the second input-output network and send the amplified signals to the first input-output network.

6. A multiport amplifier comprising:
   an input-output network having an apparatus according to claim 3; and a plurality of amplifiers arranged to amplify signals received from the input-output network and return the amplified signals to the input-output network.

7. The apparatus of claim 1, wherein the hybrid network is arranged to receive at least one second input signal via one of the plurality of second IO ports, split the at least one second input signal into a second plurality of reduced-power signals, and output the second plurality of reduced-power signals via the plurality of first IO ports.

8. The apparatus of claim 1, wherein the hybrid network is arranged to receive a second plurality of amplified signals via the plurality of second IO ports, combine said amplified signals into at least one second amplified output signal, and output the at least one second amplified output signal via the plurality of first IO ports.

9. A multiport amplifier comprising:
an input network INET having an apparatus according to claim 1;
an output network ONET having an apparatus according to claim 1; and
a plurality of amplifiers arranged to amplify signals received from the INET and send the amplified signals to the ONET.

10. A multiport amplifier comprising:
a first input-output network having an apparatus according to claim 1;
a second input-output network having an apparatus according to claim 1;
a first plurality of amplifiers arranged to amplify signals received from the first input-output network and send the amplified signals to the second input-output network; and
a second plurality of amplifiers arranged to amplify signals received from the second input-output network and send the amplified signals to the first input-output network.

11. A multiport amplifier comprising:
an input-output network having an apparatus according to claim 1; and
a plurality of amplifiers arranged to amplify signals received from the input-output network and return the amplified signals to the input-output network.

12. Apparatus comprising:
a hybrid network having at least one hybrid coupler, a plurality of first input-output IO ports and a plurality of second IO ports;
a plurality of first circulators each arranged to direct a signal to one of the first IO ports to be directed through the hybrid network to at least one of the second IO ports; and
a plurality of second circulators each arranged to direct a signal to one of the second IO ports to be directed through the hybrid network to at least one of the first IO ports,
wherein each circulator of the first and second circulators has a first port connected to the hybrid network, and has a second port and a third port,
wherein each circulator is arranged such that a signal received via the second port will be outputted to the hybrid network via the first port, and a signal received from the hybrid network via the first port will be outputted via the third port,
wherein the plurality of first circulators are arranged to receive a plurality of first input signals and the plurality of second circulators are arranged to receive a plurality of second input signals, such that the first and second input signals are directed through the hybrid network in opposite directions, and
wherein the hybrid network is arranged to receive a first plurality of amplified signals via the plurality of first IO ports, combine said amplified signals into at least one first amplified output signal, and output the first amplified output signal via the plurality of second IO ports.

13. The apparatus of claim 12, wherein the hybrid network is arranged to receive at least one second input signal via one of the plurality of second IO ports, split the at least one second input signal into a second plurality of reduced-power signals, and output the second plurality of reduced-power signals via the plurality of first IO ports.

14. The apparatus of claim 12, wherein the hybrid network is arranged to receive a second plurality of amplified signals via the plurality of second IO ports, combine said amplified signals into at least one second amplified output signal, and output the at least one second amplified output signal via the plurality of first IO ports.

* * * * *